(12) United States Patent
Azuma et al.

(10) Patent No.: US 6,803,839 B2
(45) Date of Patent: Oct. 12, 2004

(54) MULTILAYER LC COMPOSITE COMPONENT

(75) Inventors: Takahiro Azuma, Fukui (JP); Yoshihiro Fukuda, Takefu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 202 days.

(21) Appl. No.: 10/286,150

(22) Filed: Nov. 2, 2002

(65) Prior Publication Data

US 2003/0095016 A1 May 22, 2003

(30) Foreign Application Priority Data

Nov. 16, 2001 (JP) ........................................ 2001-351477

(51) Int. Cl.$^7$ ................................................ H03H 7/01
(52) U.S. Cl. .................... 333/185; 333/184; 361/321.2; 361/321.3
(58) Field of Search ................................ 333/185, 184, 333/204, 202, 175, 219, 222; 361/321.2, 321.3

(56) References Cited

U.S. PATENT DOCUMENTS

| | | | | |
|---|---|---|---|---|
| 5,530,411 A | * | 6/1996 | Nakata et al. | 333/185 |
| 6,133,809 A | * | 10/2000 | Tomohiro et al. | 333/185 |
| 6,160,461 A | * | 12/2000 | Azuma et al. | 333/172 |
| 6,476,690 B1 | * | 11/2002 | Nakata et al. | 333/185 |
| 6,542,052 B2 | * | 4/2003 | Matsumura et al. | 333/175 |
| 6,587,020 B2 | * | 7/2003 | Tojyo | 333/185 |
| 6,599,855 B2 | * | 7/2003 | Naito | 501/139 |
| 6,762,656 B1 | * | 7/2004 | Kobayashi et al. | 333/184 |

FOREIGN PATENT DOCUMENTS

| | | |
|---|---|---|
| JP | 59-144919 | 9/1984 |
| JP | 1-265509 | 10/1989 |
| JP | 3-253013 | 11/1991 |
| JP | 6-296102 | 10/1994 |
| JP | 9-294041 | 10/1997 |
| JP | 2000-59168 | 2/2000 |

* cited by examiner

Primary Examiner—Robert Pascal
Assistant Examiner—Kimberly Glenn
(74) Attorney, Agent, or Firm—Keating & Bennett, LLP

(57) ABSTRACT

A multilayer LC composite component includes a coil unit including a stack of coil conductors, two adjacent coil conductors being separated by an insulating layer (dielectric layer) and being electrically connected to each other and a capacitor unit including a ground-side capacitor electrode and a signal-side capacitor electrode which oppose each other with an insulating layer disposed therebetween, the ground-side capacitor electrode having an electrode-free area at a central region thereof and the signal-side capacitor electrode being electrically connected to the coil unit via the electrode-free area. The ground-side capacitor electrode extends to at least two opposing sides of the insulating layer (dielectric layer) and has a cut portion (cross-shaped cut portion) which extends continuously from the electrode-free area.

17 Claims, 11 Drawing Sheets

MULTILAYER LC COMPOSITE COMPONENT

BACKGROUND OF THE INVENTION

1. Field of the Invention

The present invention relates to multilayer inductor-capacitor (LC) composite components including a coil unit and a capacitor unit, and more specifically relates to a multilayer LC composite component which includes a capacitor unit having a ground-side capacitor electrode and a signal-side capacitor electrode which oppose each other with an insulating layer therebetween, the ground-side capacitor electrode having an electrode-free area at a central region thereof and the signal-side capacitor electrode being electrically connected to the coil unit via the electrode-free area.

2. Description of the Related Art

FIGS. 9, 10, and 11 show a perspective view, an exploded perspective view, and an equivalent circuit diagram, respectively, of a multilayer LC noise filter as an example of a known multilayer LC composite component. This multilayer LC noise filter is a so-called T-type LC noise filter constructed by disposing a first external electrode 55a, a second external electrode 55b, and an external grounding electrode 56 on a device 54 including a first coil unit 51, a second coil unit 52, and a capacitor unit 53 including signal-side capacitor electrodes 63 and ground-side capacitor electrodes 65. The first external electrode 55a is electrically connected to a base end portion (IN-side end portion) 51a of the first coil unit 51, the second external electrode 55b is electrically connected to a base end portion (OUT-side end portion) 52a of the second coil unit 52, and the external grounding electrode 56 is electrically connected to the ground-side capacitor electrodes 65.

The manufacturing process of this multilayer LC composite component will be described below with reference to FIG. 12. First, magnetic ceramic green sheets 62 having internal electrodes (coil patterns) 61 which define the first coil unit 51, dielectric ceramic green sheets (dielectric layers) 64 having the signal-side capacitor electrodes 63 (see FIG. 13B) which define the capacitor unit 53, dielectric ceramic green sheets (dielectric layers) 66 having the ground-side capacitor electrodes 65 (see FIG. 13A) which are to be grounded, magnetic ceramic green sheets 68 having internal electrodes (coil patterns) 67 which define the second coil unit 52, and external layer sheets (not shown) are laminated and press-bonded. Then, the patterns (electrodes) are electrically connected to each other by via holes, and firing is performed under predetermined conditions. Lastly, as shown in FIG. 9, the first external electrode 55a, the second external electrode 55b, and the external grounding electrode 56 are formed.

The above-described conventional multilayer LC composite component suffers from problems in that the insulation resistance decreases because of cracks which occur in the device 54 along the surfaces of the ground-side capacitor electrodes 65 due to the following reasons:

(1) As shown in FIG. 13A, each of the ground-side capacitor electrodes 65 has an oblong rectangular shape in plan view with an electrode-free area 71 at the central region thereof, and is formed such that the main portion of the corresponding ceramic green sheet 66 is covered by the ground-side capacitor electrode 65. Therefore, sufficient bonding strength cannot be obtained between the surfaces of the ceramic green sheets 66 on which the ground-side capacitor electrodes 65 are formed and the adjacent ceramic green sheets 64.

(2) The main portions of the ground-side capacitor electrodes 65 are located at the inside of the internal electrodes (coil patterns) 61 and 67 disposed at both sides of the capacitor unit 53, and penetrating electrodes (via-hole electrodes) 70 (see FIG. 13A) extend through the dielectric ceramic green sheets 64 and 66 at the center thereof. Therefore, pressure cannot be applied effectively in a pressing step of the laminating process, and sufficient bonding strength cannot be obtained between the layers.

(3) The external grounding electrode 56, which is electrically connected to the ground-side capacitor electrodes 65, is disposed on the device 54 so as to completely surround the region where the capacitor unit 53 is disposed. Therefore, the device 54 receives a large thermal stress at the region where the capacitor unit 53 is disposed in the firing process or in the process of attaching the external electrodes by firing due to the difference in the degree of thermal expansion and contraction between the external grounding electrode 56 and the device 54.

Although the thermal stress applied to the device can be reduced to some extent by forming the external grounding electrode only at a portion of the device so that it does not completely surround the device, this does not satisfactorily solve the above-described problem.

In addition, similarly to the case of the ground-side capacitor electrodes 65, cracks also occur along the surfaces of the signal-side capacitor electrodes 63 due to thermal contraction in the firing process, and therefore the insulation resistance decreases, although this is not such a big problem since the area of the signal-side capacitor electrodes 63 is generally smaller than that of the ground-side capacitor electrodes 65 in the capacitor unit 53.

SUMMARY OF THE INVENTION

Accordingly, in order to solve the above-described problems, preferred embodiments of the present invention provide a high-reliability multilayer LC composite component in which separation between layers at the capacitor unit including the ground-side capacitor electrodes and the signal-side capacitor electrodes is prevented so that the insulation resistance does not decrease.

According to a first preferred embodiment of the present invention, a multilayer LC composite component includes a coil unit including a stack of coil conductors, two adjacent coil conductors being separated by an insulating layer and being electrically connected to each other, and a capacitor unit including a ground-side capacitor electrode and a signal-side capacitor electrode which oppose each other with an insulating layer disposed therebetween, the ground-side capacitor electrode having an electrode-free area at an approximately central region thereof and the signal-side capacitor electrode being electrically connected to the coil unit via the electrode-free area, wherein the ground-side capacitor electrode extends to at least two opposing sides of the insulating layer and has a cut portion which extends continuously from the electrode-free area.

As described above, the ground-side capacitor electrode has the electrode-free area at the approximately central region, and a penetrating electrode (via hole electrode) used for providing electrical connection to the signal-side capacitor electrode is disposed in the electrode-free area. By forming the cut portion (another electrode-free area) in the ground-side capacitor electrode such that the cut portion and the above-described electrode-free area are connected to each other, the area where the electrode is not formed in the insulating layer on which the ground-side capacitor electrode is formed can be increased, so that the bonding strength between the insulating layer and the adjacent layer can also be increased. Accordingly, cracks in the device along the surface of the ground-side capacitor electrode due to the thermal contraction in the firing process are effectively prevented and minimized. As a result, a highly reliable multilayer LC composite component in which the insulation resistance does not decrease can be obtained.

In addition, since the electrode-free area and the cut portion of the ground-side capacitor electrode are connected to each other on the insulating layer, the bonding strength between the insulating layer and the adjacent layer can also be further increased.

Furthermore, in the case in which the electrode is formed by the screen printing method using an electrode paste, the area of a continuous region where the electrode paste does not pass through a screen mask can be increased. Accordingly, bleeding can be reduced in the printing process, so that the pressure resistance and the insulation resistance of the product can be increased.

In addition, in the multilayer LC composite component of preferred embodiments of the present invention, the ground-side capacitor electrode may have line symmetry with respect to a direction that is substantially parallel to the two opposing sides of the insulating layer.

When the ground-side capacitor electrode has line symmetry with respect to a direction that is substantially parallel to the two opposing sides of the insulating layer to which the ground-side capacitor electrode extends, the area where the ground-side capacitor electrode is formed and the area where the electrode is not formed can be arranged in a balanced manner. Therefore, the surface of the insulating layer on which the ground-side capacitor electrode is formed can be reliably bonded to the adjacent layer. Accordingly, cracks along the surface of the ground-side capacitor electrode due to the thermal contraction in the firing process can be more reliably prevented and minimized. As a result, a highly reliable multilayer LC composite component in which the insulation resistance does not decrease can be obtained.

In addition, in the multilayer LC composite component of preferred embodiments of the present invention, the ground-side capacitor electrode may be divided by the cut portion.

When the ground-side capacitor electrode has a pattern such that it is divided by the cut portion, the area where the electrode is not formed in the insulating layer on which the ground-side capacitor electrode is formed can be further increased and be arranged efficiently. Accordingly, the bonding strength between the insulating layer and the adjacent layer can be further increased.

In addition, in the multilayer LC composite component of preferred embodiments of the present invention, the ground-side capacitor electrode may be divided into four sections by the cut portion, and two of the four sections extend to one of the two opposing sides of the dielectric layer and the other two of the four sections extend to the other one of the two opposing sides.

When the ground-side capacitor electrode is divided into four sections by the cut portion and two of the four sections extend to one of the two opposing sides of the insulating layer and the other two of the four sections extend to the other one of the two opposing sides, the area where the electrode is not formed in the insulating layer on which the ground-side capacitor electrode is formed can be further increased and be arranged more efficiently. Accordingly, the bonding strength between the insulating layer and the adjacent layer can be further increased, and the present invention can be more effectively applied.

Other features, elements, characteristics and advantages of the present invention will become more apparent from the following detailed description of preferred embodiments thereof with reference to the attaché drawings.

DETAILED DESCRIPTION OF PREFERRED EMBODIMENTS

Preferred embodiments of the present invention will be described in detail below with reference to the accompanying drawings.

First Preferred Embodiment

Figure 1:
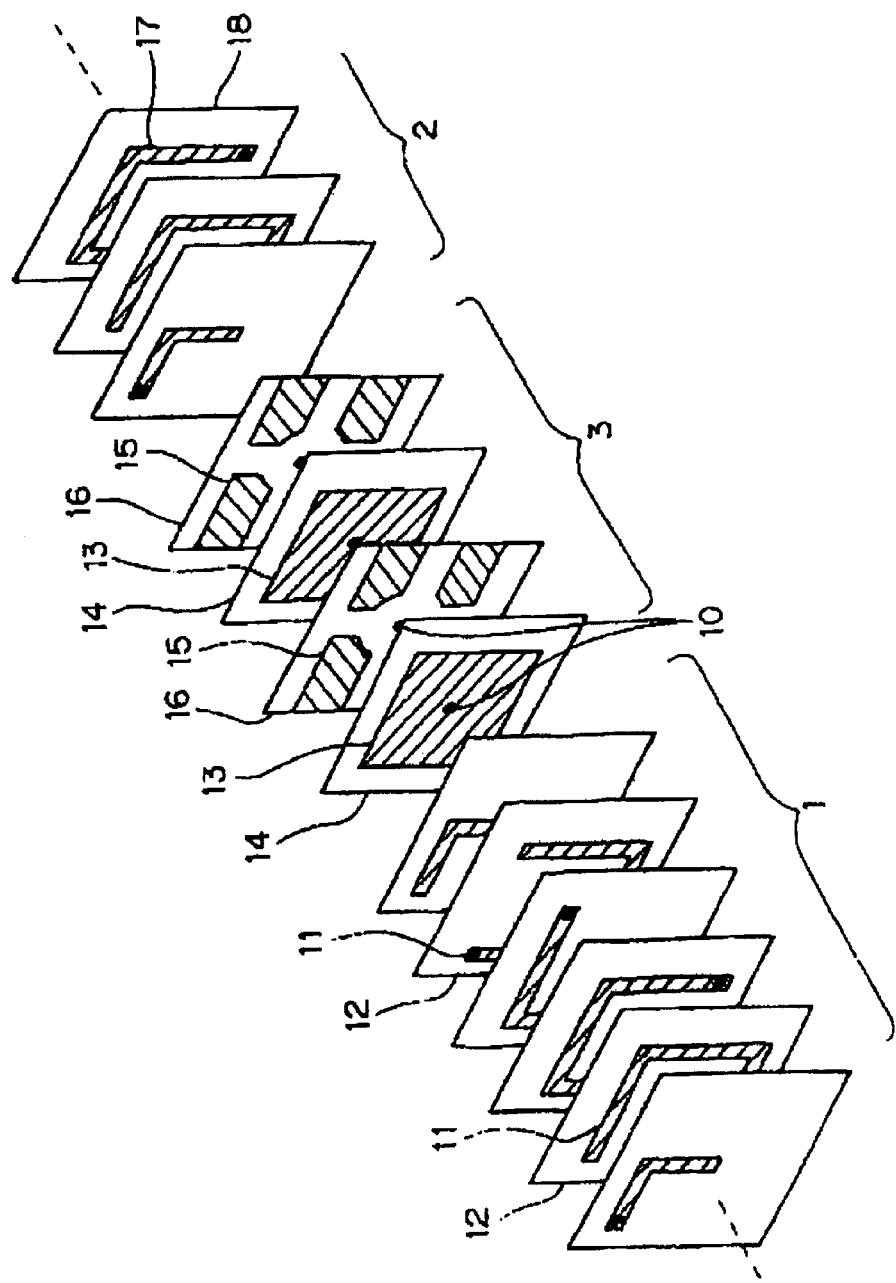
FIG. 1 is an exploded perspective view of the main portion of a multilayer LC composite component according to a first preferred embodiment of the present invention.
Figure 2A:
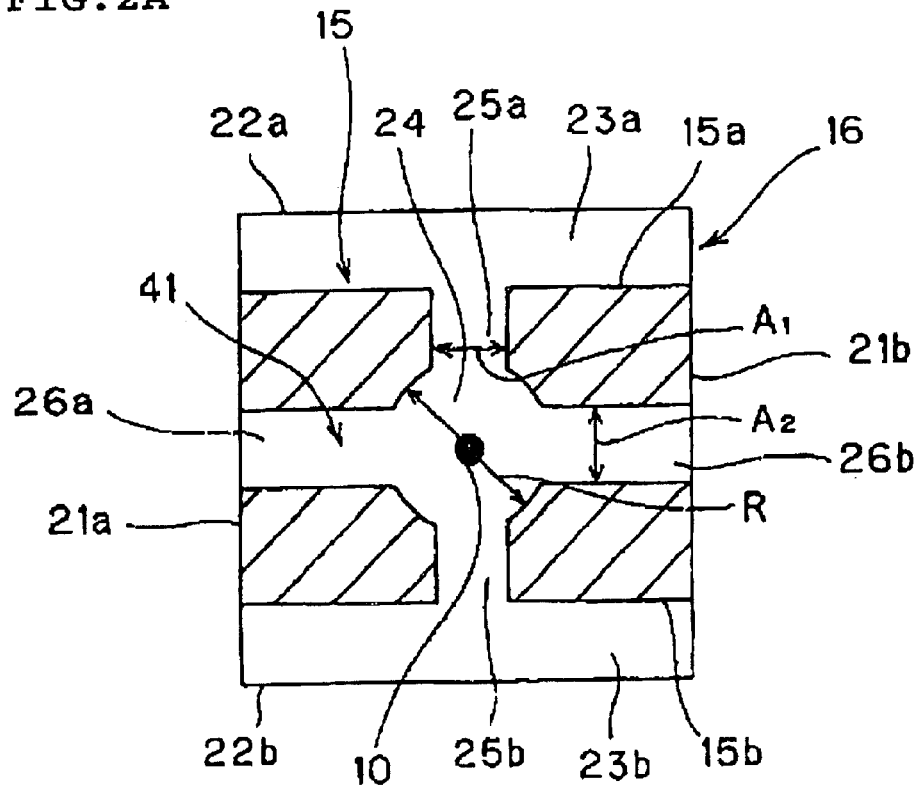
FIG. 2A is a plan view showing a pattern of a ground-side capacitor electrode included in the multilayer LC composite component according to the first preferred embodiment of the present invention and FIG. 2B is a plan view showing a pattern of a signal-side capacitor electrode included in the multilayer LC composite component according to the first preferred embodiment of the present invention.
Figure 2B:
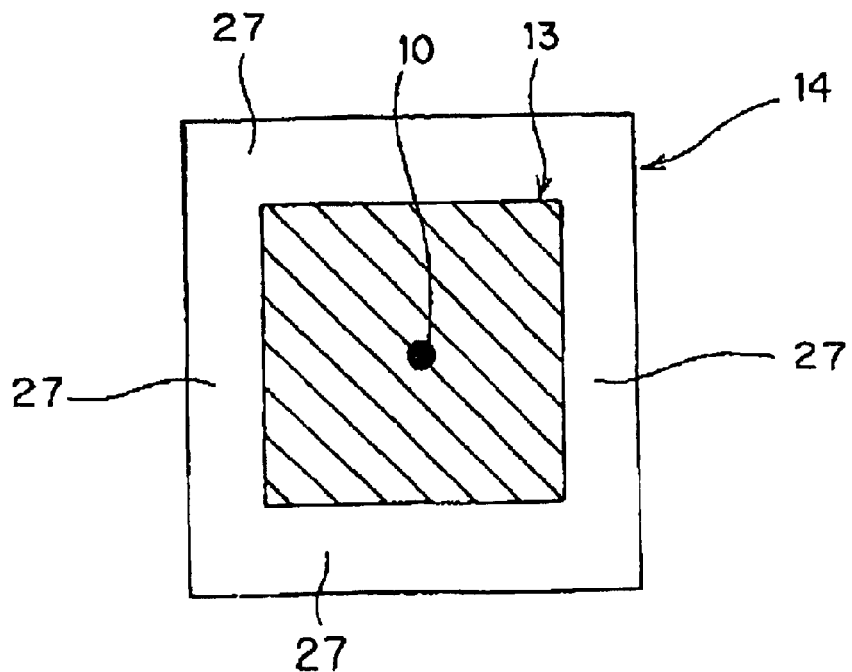
Figure 3:
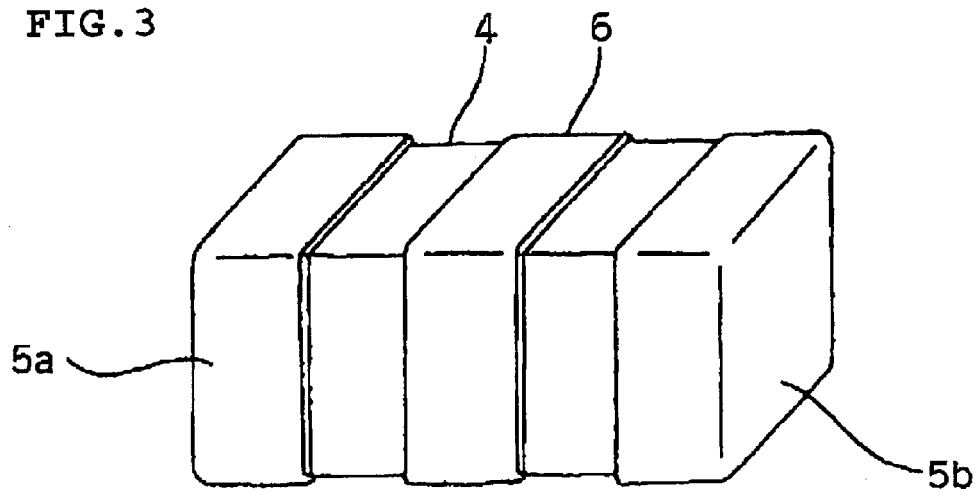
FIG. 3 is a perspective view of the multilayer LC composite component according to the first preferred embodiment of the present invention.
Figure 4:
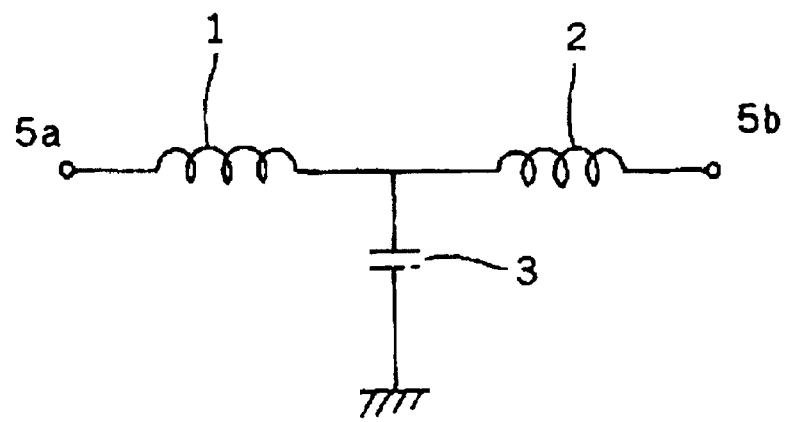
FIG. 4 is an equivalent circuit diagram of the multilayer LC composite component according to the first preferred embodiment of the present invention.

FIG. 1 is an exploded perspective view of the main portion of a multilayer LC composite component according to a first preferred of the present invention, FIG. 2A is a plan view showing a pattern of a ground-side capacitor electrode included in the multilayer LC composite component, FIG. 2B is a plan view showing a pattern of a signal-side capacitor electrode included in the multilayer LC composite component, FIG. 3 is a perspective view of the multilayer LC composite component, and FIG. 4 is an equivalent circuit diagram of the multilayer LC composite component.

The multilayer LC composite component according to the first preferred embodiment is preferably a T-type LC noise filter whose equivalent circuit diagram is shown in FIG. 4. As shown in FIG. 3, the multilayer LC composite component is constructed by disposing a first external electrode 5a, a second external electrode 5b, and an external grounding electrode 6 on a device 4. With reference to FIG. 1, the device 4 includes a first coil unit 1, a second coil unit 2, and a capacitor unit 3 including signal-side capacitor electrodes 13 and ground-side capacitor electrodes 15. The first external electrode 5a is electrically connected to the first coil unit 1, the second external electrode 5b is electrically connected to the second coil unit 2, and the external grounding electrode 6 is electrically connected to the ground-side capacitor electrodes 15. In addition, as shown in FIG. 1, penetrating electrodes (via-hole electrodes) 10, which are electrically connected to the signal-side capacitor electrodes 13, extend through electrode-free areas where the ground-side capacitor electrodes 15 are not provided.

The manufacturing process of this multilayer LC composite component will be described below with reference to FIG. 1. First, dielectric ceramic green sheets (dielectric layers) 12 having internal electrodes (coil patterns) 11 which define the first coil unit 1, dielectric ceramic green sheets (dielectric layers) 14 having the signal-side capacitor electrodes 13 which define the capacitor unit 3, dielectric ceramic green sheets (dielectric layers) 16 having the ground-side capacitor electrodes 15 which are to be grounded, dielectric ceramic green sheets (dielectric layers) 18 having internal electrodes (coil patterns) 17 which define the second coil unit 2, and external layer sheets (not shown) are laminated and press-bonded. Then, the patterns (electrodes) are electrically connected to each other by via holes, and firing is performed under predetermined conditions. Lastly, as shown in FIG. 3, the first and second external electrodes 5a and 5b and the external grounding electrode 6 are formed.

In the first preferred embodiment, the dielectric ceramic green sheets 12, 14, 16 and 18 and the external layer sheets (not shown) preferably have an approximately square shape in plan view. However, the dielectric ceramic green sheets 12, 14, 16 and 18 and the external layer sheets may also have an oblong rectangular shape in plan view, or other suitable shape.

In the multilayer LC composite component according to the first preferred embodiment, as shown in FIG. 2A, each of the ground-side capacitor electrodes 15 included in the capacitor unit 3 has an electrode-free area 24 around the penetrating electrode (via-hole electrode) 10 formed at the approximate center thereof and a cross-shaped cut portion (electrode-free area) 41. The cross-shaped cut portion 41 includes two slit-shaped cut portions (electrode-free areas) 25a and 25b which extend approximately vertically, and another two slit-shaped cut portions (electrode-free areas) 26a and 26b which extend approximately horizontally.

More specifically, the ground-side capacitor electrodes 15 is preferably divided into four sections by the slit-shaped cut portions 25a, 25b, 26a, and 26b, Two of the four sections extend to one of two opposing sides 21a and 21b of the corresponding dielectric layer 16, and the other two of the four sections extend to the other one of the two opposing sides 21a and 21b.

In addition, band-shaped electrode-free areas (parallel electrode-free areas) 23a and 23b extend approximately horizontally between sides 15a and 15b of the ground-side capacitor electrode 15 and two opposing sides 22a and 22b of dielectric layer 16, the sides 15a and 15b and the sides 22a and 22b being substantially parallel to the direction in which the four sections of the ground-side capacitor electrode 15 extend to the two opposing sides 21a and 21b.

In addition, in the first preferred embodiment, the electrode-free area 24 has an approximately circular shape, and the diameter R thereof is larger than the width $A_1$ of the slit-shaped cut portions 25a and 25b and the width $A_2$ of the slit-shaped cut portions 26a and 26b. The width $A_1$ of the slit-shaped cut portions 25a and 25b and the width $A_2$ of the slit-shaped cut portions 26a and 26b may be the same or different.

In the multilayer LC composite component according to the first preferred embodiment, as shown in FIG. 2B, each of the signal-side capacitor electrodes 13 included in the capacitor unit 3 preferably has a substantially square pattern, and an electrode-free area 27 is provided at the peripheral region of the corresponding dielectric layer 14.

As described above, in the multilayer LC composite component according to the first preferred embodiment, each of the ground-side capacitor electrodes 15 has a pattern including the electrode-free area 24 at the approximately central region and the cross-shaped cut portion 41 formed of two slit-shaped cut portions (electrode-free areas) 25a and 26b which extend approximately vertically and two slit-shaped cut portions (electrode-free areas) 26a and 26b which extend approximately horizontally. Therefore, the bonding strength between the surfaces of the dielectric layers 16 on which the ground-side capacitor electrodes 15 are formed and the adjacent layers (the dielectric layers 14 in FIG. 1) can be increased. Accordingly, cracks along the surfaces of the ground-side capacitor electrodes 15 due to the thermal contraction in the firing process can be prevented and minimized. As a result, a highly reliable multilayer LC composite component in which the insulation resistance does not decrease can be obtained.

Second Preferred Embodiment

Figure 5A:
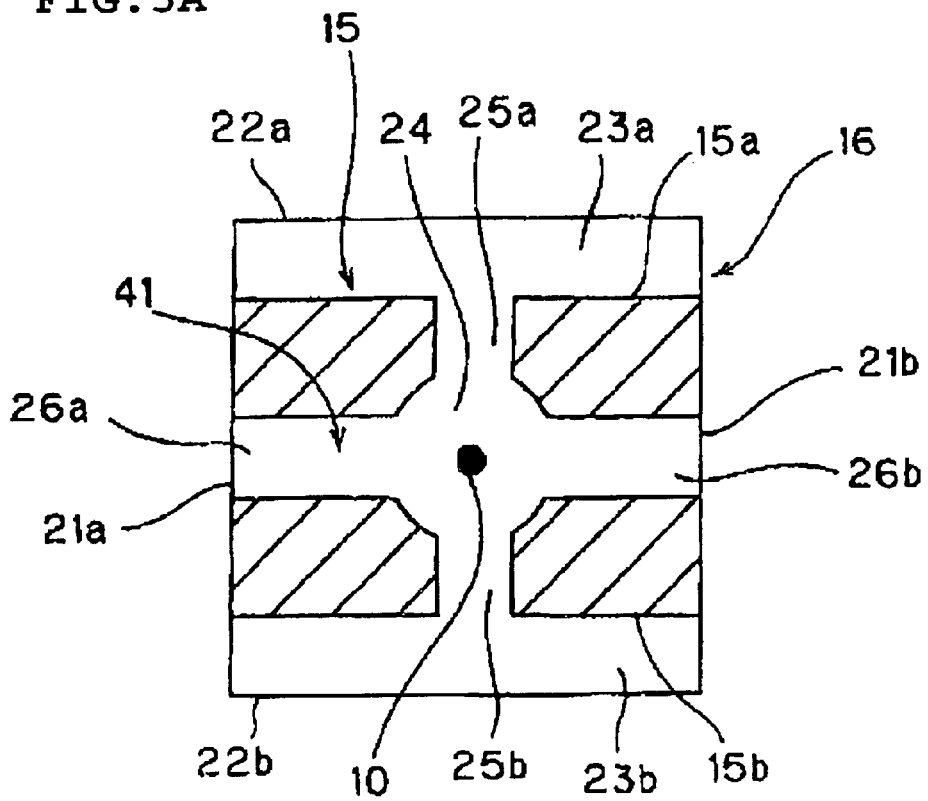
FIG. 5A is a plan view showing a pattern of a ground-side capacitor electrode included in a multilayer LC composite component according to a second preferred embodiment of the present invention.
Figure 5B:
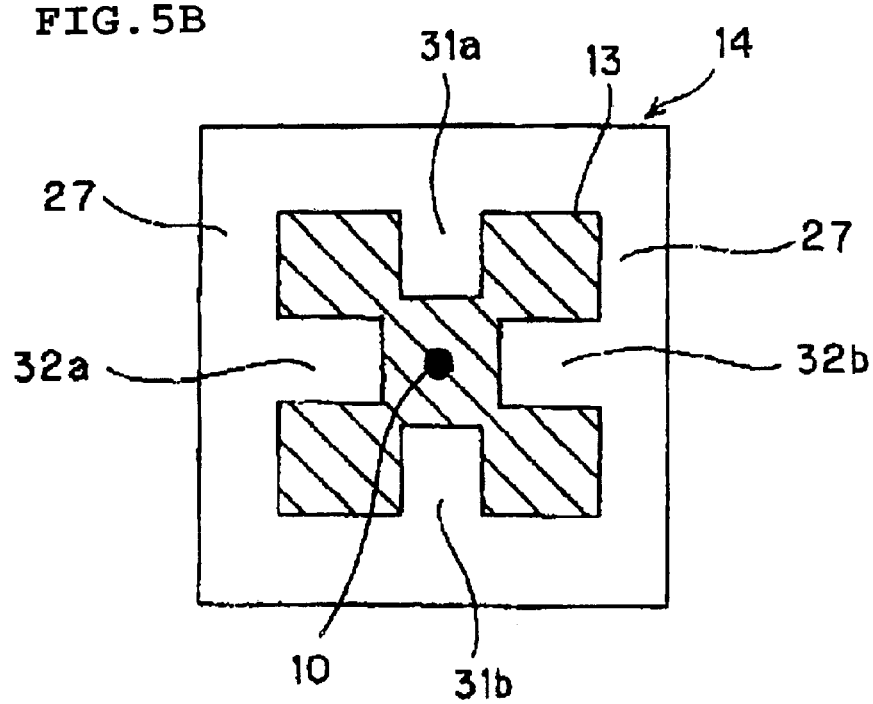
FIG. 5B is a plan view showing a pattern of a signal-side capacitor electrode included in the multilayer LC composite component.

FIG. 5A is a plan view showing a pattern of a ground-side capacitor electrode included in a multilayer LC composite component according to a second preferred embodiment of the present invention, and FIG. 5B is a plan view showing a pattern of a signal-side capacitor electrode included in the multilayer LC composite component.

Other constructions of the multilayer LC composite component according to the second preferred embodiment are preferably the same as those of the multilayer LC composite component according to the first preferred embodiment, and explanations thereof are thus omitted to avoid repetition. In addition, in FIGS. 5A and 5B, portions corresponding to those shown in FIGS. 2A and 2B are denoted by the same reference numerals.

In the second preferred embodiment, similarly to the first preferred embodiment, each of the ground-side capacitor electrodes 15 has an electrode-free area 24 at the approximately central region thereof and a cross-shaped cut portion 41 including two slit-shaped cut portions (electrode-free areas) 25a and 26b which extend approximately vertically and two slit-shaped cut portions (electrode-free areas) 26a and 26b which extend approximately horizontally. In addition, each of the signal-side capacitor electrodes 13 has four electrode-free areas 31a, 31b, 32a, and 32b at positions corresponding to the cross-shaped cut portion 41 of the ground-side capacitor electrode 15. Accordingly, each of the signal-side capacitor electrodes 13 has a substantially X-shaped pattern.

In the multilayer LC composite component according to the second preferred embodiment, each of the signal-side capacitor electrodes 13 has a substantially X-shaped pattern by providing the electrode-free areas 31a, 31b, 32a, and 32b. Accordingly, not only the bonding strength between the surfaces of the dielectric layers 16 on which the ground-side capacitor electrodes 15 are formed and the adjacent layers is increased as in the first preferred embodiment, but also the bonding strength between the surfaces of the dielectric layers 14 on which the signal-side capacitor electrodes 13 are formed and the adjacent layers (the dielectric layer 12 and the dielectric layer 16 in FIG. 1) is increased. Therefore, the reliability of the multilayer LC composite component can be further increased.

Third Preferred Embodiment

Figure 6A:
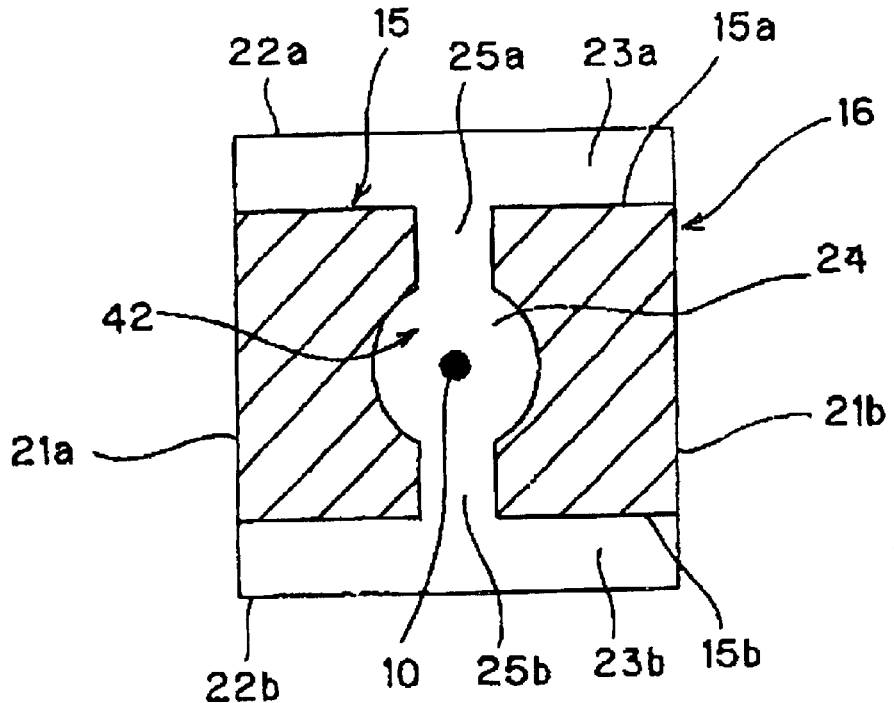
FIG. 6A is a plan view showing a pattern of a ground-side capacitor electrode included in a multilayer LC composite component according to a third preferred embodiment of the present invention.
Figure 6B:
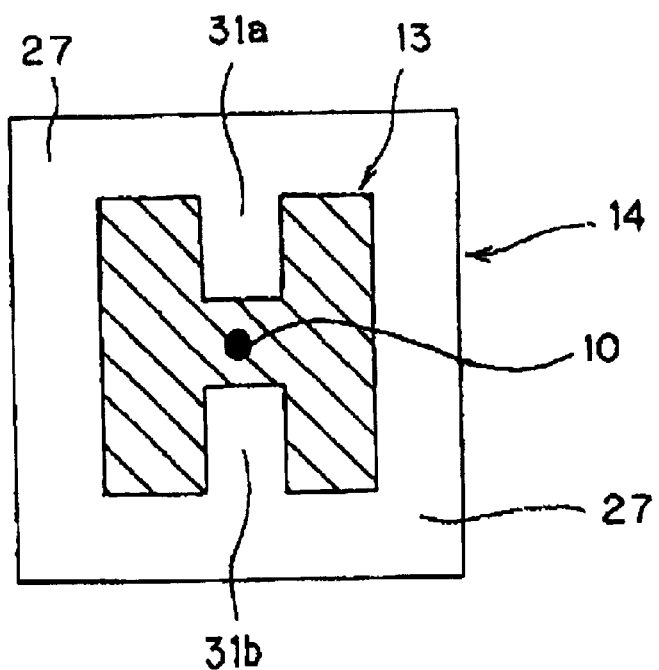
FIG. 6B is a plan view of an electrode pattern of a signal-side capacitor electrode included in the multilayer LC composite component.

FIG. 6A is a plan view showing a pattern of a ground-side capacitor electrode included in a multilayer LC composite component according to a third preferred embodiment of the present invention, and FIG. 6B is a plan view showing a pattern of a signal-side capacitor electrode included in the multilayer LC composite component.

Other constructions of the multilayer LC composite component according to the third preferred embodiment are preferably the same as those of the multilayer LC composite component according to the first preferred embodiment, and explanations thereof are thus omitted to avoid repetition. In addition, in FIGS. 6A and 6B, portions corresponding to those shown in FIGS. 2A and 2B are denoted by the same reference numerals.

In the third preferred embodiment, each of the ground-side capacitor electrodes 15 has an electrode-free area 24 around the penetrating electrode (via-hole electrode) 10 provided at the approximate center and a line-shaped cut portion (electrode-free area) 42 including two slit-shaped cut portions (electrode-free areas) 25a and 25b which extend approximately vertically. Accordingly, the ground-side capacitor electrode 15 is divided into two sections by the above-described line-shaped cut portion 42, and has a pattern having line symmetry with respect to a direction that is substantially parallel to the two opposing sides of the dielectric layer 16, that is, with respect to the line-shaped cut portion 42, in plan view.

In addition, each of the signal-side capacitor electrodes 13 has electrode-free areas 31a and 31b at positions corresponding to the slit-shaped cut portions (electrode-free areas) 25a and 25b of the ground-side capacitor electrode 15. Accordingly, each of the signal-side capacitor electrodes 13 preferably has a substantially H-shaped pattern.

As described above, in the multilayer LC composite component according to the third preferred embodiment, each of the ground-side capacitor electrodes 15 is divided into two sections by the line-shaped cut portion (electrode-free area) 42 which extends vertically, and has a pattern having line symmetry with respect to the line-shaped cut portion 42 in plan view. In addition, each of the signal-side capacitor electrodes 13 preferably has a substantially H-shaped pattern. Accordingly, compared to the known technique in which the ground-side capacitor electrodes do not have the slit-shaped cut portions (electrode-free areas) and the signal-side capacitor electrodes 13 do not have the electrode-free areas, bonding strength between the layers can be increased. Accordingly, a highly reliable multilayer LC composite component can be obtained.

Fourth Preferred Embodiment

Figure 7A:
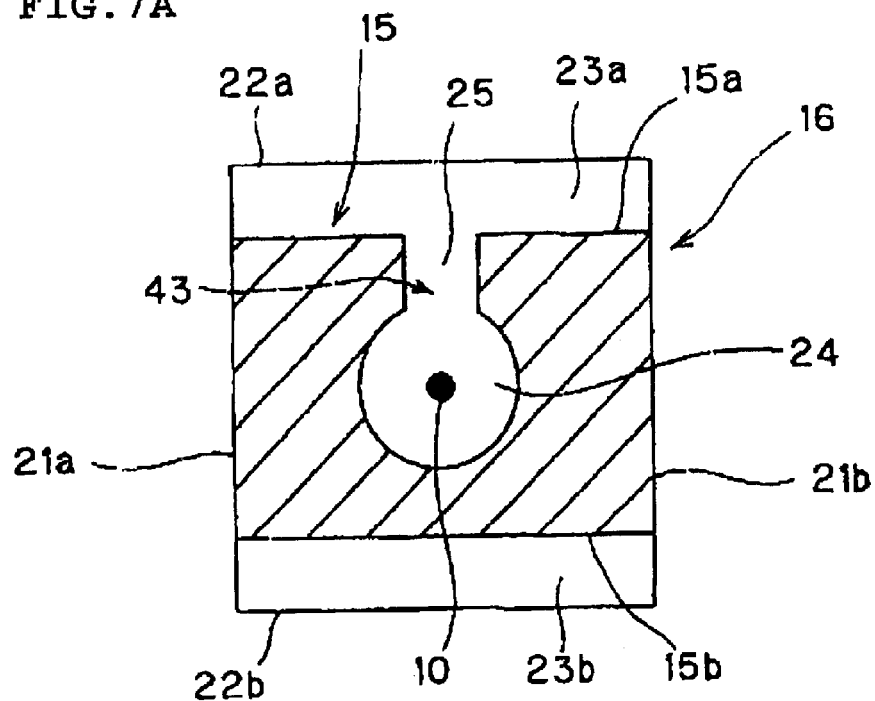
FIG. 7A is a plan view showing a pattern of a ground-side capacitor electrode included in a multilayer LC composite component according to a fourth preferred embodiment of the present invention.
Figure 7B:
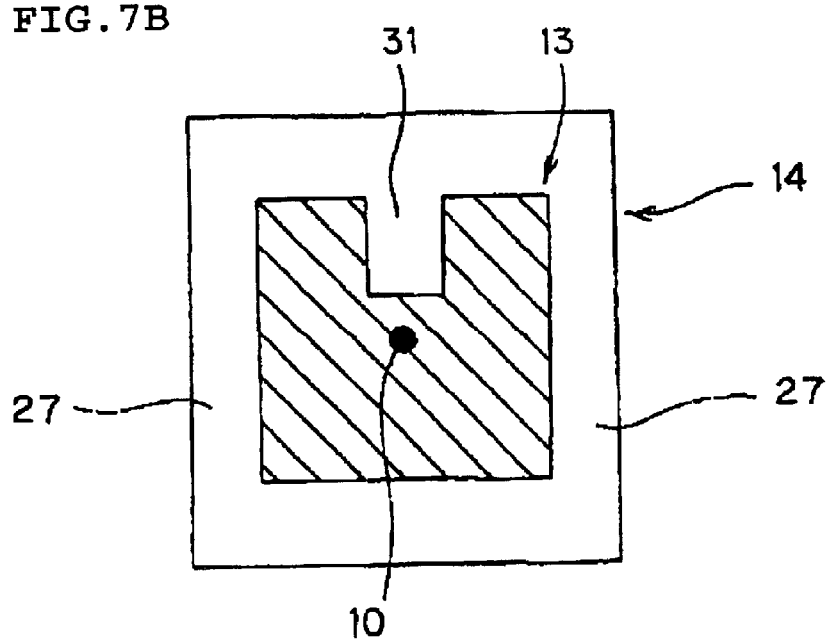
FIG. 7B is a plan view showing a pattern of a signal-side capacitor electrode included in the multilayer LC composite component.

FIG. 7A is a plan view showing a pattern of a ground-side capacitor electrode included in a multilayer LC composite component according to a fourth preferred embodiment of the present invention, and FIG. 7B is a plan view showing a pattern of a signal-side capacitor electrode included in the multilayer LC composite component.

Other constructions of the multilayer LC composite component according to the fourth preferred embodiment are preferably the same as those of the multilayer LC composite component according to the first preferred embodiment, and explanations thereof are thus omitted to avoid repetition. In addition, in FIGS. 7A and 7B, portions corresponding to those shown in FIGS. 2A and 2B are denoted by the same reference numerals.

In the fourth preferred embodiment, each of the ground-side capacitor electrodes 15 has an electrode-free area 24 around the penetrating electrode (via-hole electrode) 10 formed at the approximate center and an open portion (electrode-free area) 43 formed of a single slit-shaped cut portion (electrode-free area) 25 which extends approximately vertically. Accordingly, the ground-side capacitor electrode 15 has a substantially ring-shaped configuration that is open at the line-shaped open portion (electrode-free area) 43.

In addition, each of the signal-side capacitor electrodes 13 has a single electrode-free area 31 having a shape that is similar to the shape of the slit-shaped cut portion (electrode-free area) 25 at a position corresponding to the slit-shaped cut portion (electrode-free area) 25. Accordingly, each of the signal-side capacitor electrodes 13 has a substantially bracket-shaped pattern.

As described above, in the fourth preferred embodiment, each of the ground-side capacitor electrodes 15 has a substantially ring-shaped configuration that is open at the line-shaped open portion (electrode-free area) 43, and each of the signal-side capacitor electrodes 13 has a substantially bracket-shaped pattern by providing the electrode-free area 31. Also in this case, the bonding strength between the layers can be increased and a high-reliability multilayer LC composite component can be obtained.

In the above-described second to fourth preferred embodiments, the ground-side capacitor electrodes are provided with the slit-shaped electrode-free areas, and the signal-side capacitor electrodes are provided with another slit-shaped electrode-free areas having a similar shape at positions corresponding to the slit-shaped electrode-free areas formed in the ground-side capacitor electrodes. More specifically, the ground-side capacitor electrodes and the signal-side capacitor electrodes are provided with the same number of electrode free areas having a similar shape. However, the number of slit-shaped electrode-free areas formed in the signal-side capacitor electrodes may be smaller than the number of slit-shaped electrode-free areas formed in the ground-side capacitor electrodes. Alternatively, in accordance with the situation, the number of slit-shaped electrode-free areas formed in the signal-side capacitor electrodes may be larger than the number of slit-shaped electrode-free areas formed in the ground-side capacitor electrodes.

Fifth Preferred Embodiment

Figure 8:
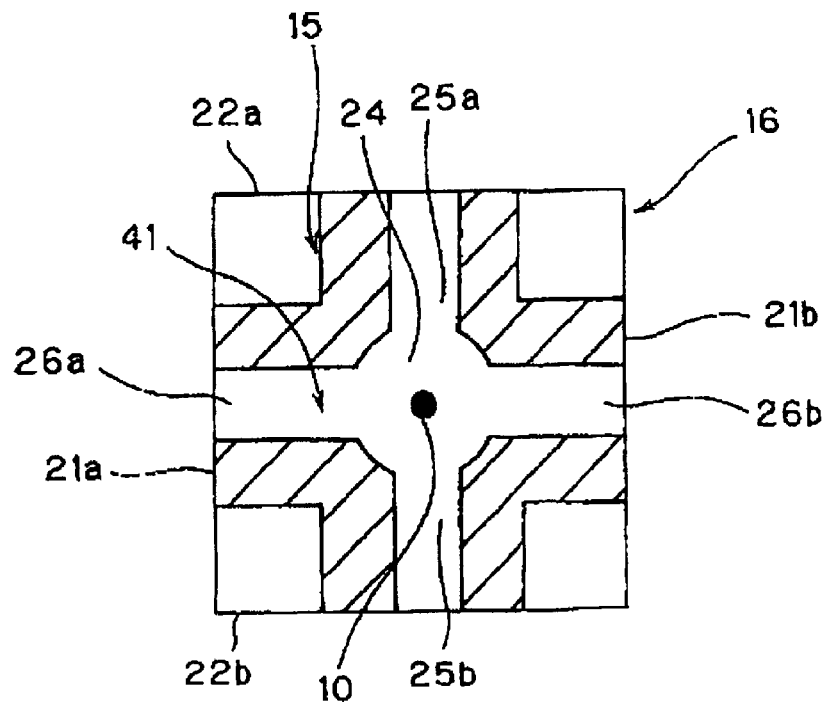
FIG. 8 is a plan view showing a pattern of a ground-side capacitor electrode included in a multilayer LC composite component according to a fifth preferred embodiment of the present invention.
Figure 9:
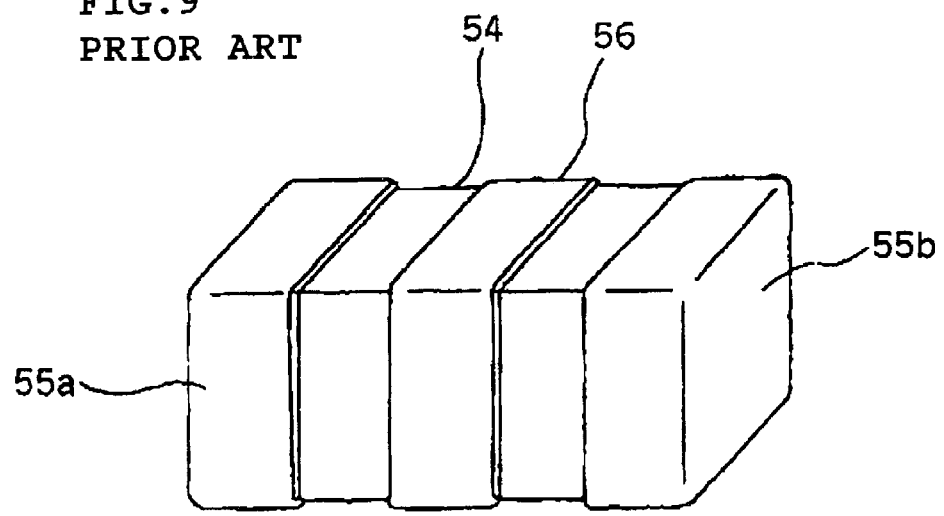
FIG. 9 is a perspective view of a known multilayer LC composite component.
Figure 10:
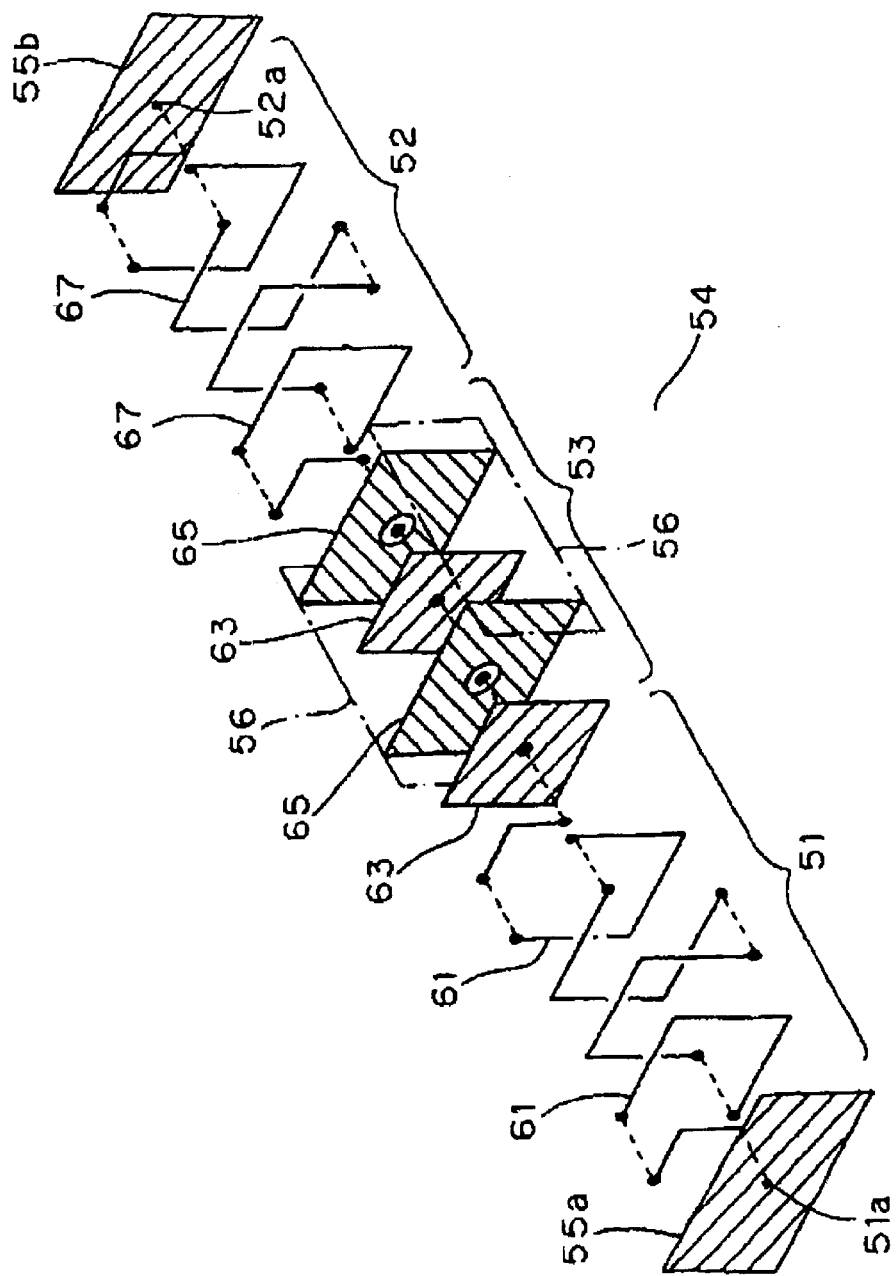
FIG. 10 is an exploded perspective view of the known multilayer LC composite component.
Figure 11:
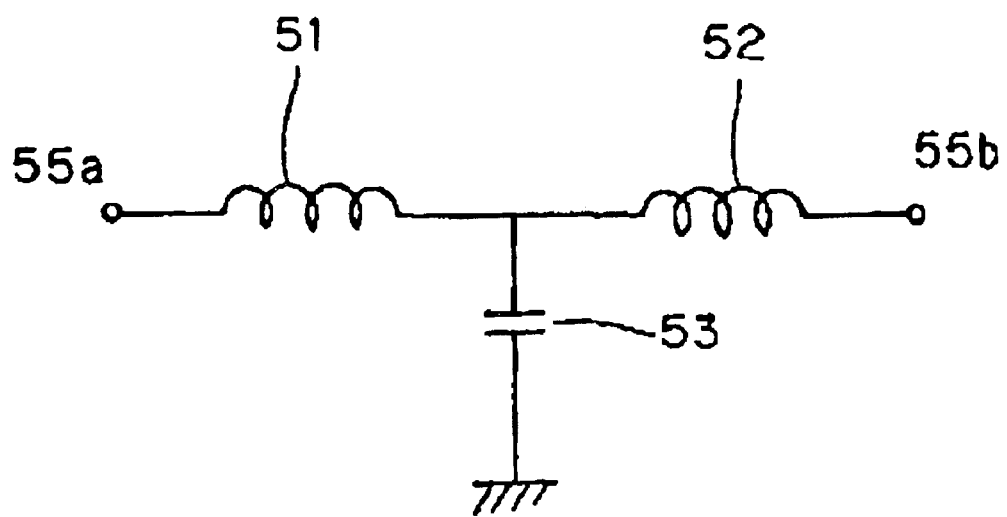
FIG. 11 is an equivalent circuit diagram of the known multilayer LC composite component.
Figure 12:
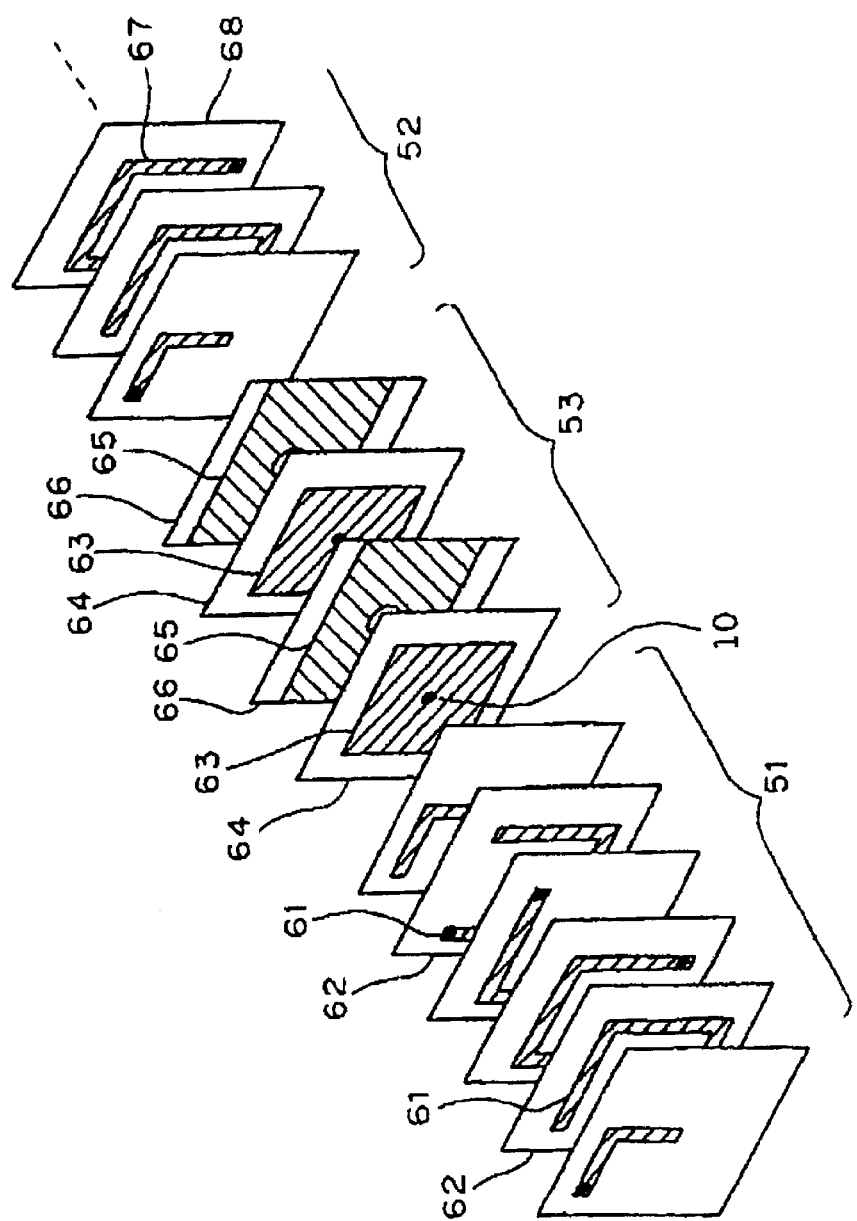
FIG. 12 is a diagram showing a manner in which the known multilayer LC composite component is manufactured.
Figure 13A:
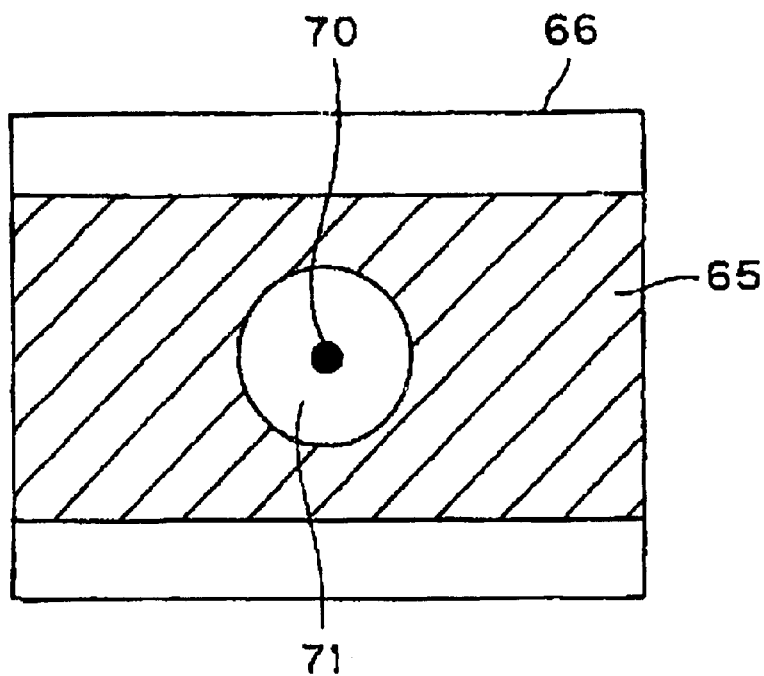
FIG. 13A is a plan view showing a pattern of a ground-side capacitor electrode included in the known multilayer LC composite component.
Figure 13B:
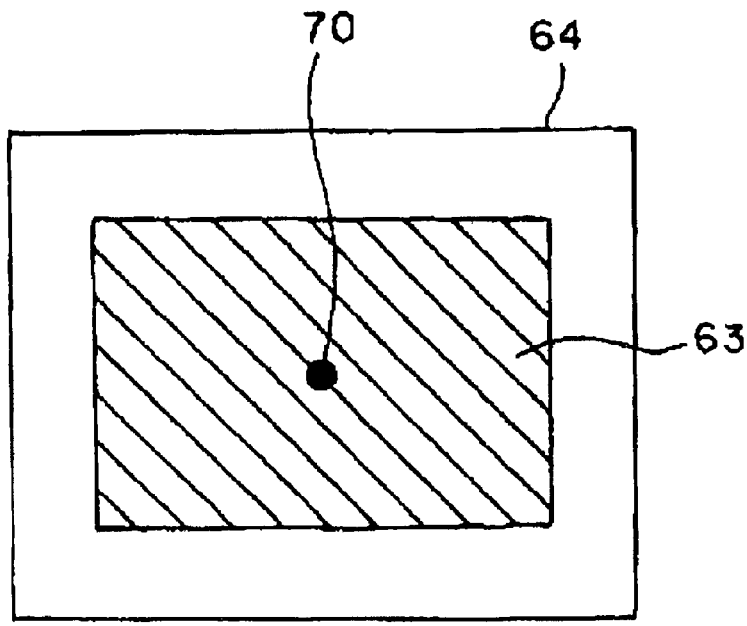
FIG. 13B is a plan view showing a pattern of a signal-side capacitor electrode included in the known multilayer LC composite component.

FIG. 8 is a plan view showing a pattern of a ground-side capacitor electrode included in a multilayer LC composite component according to a fifth preferred embodiment of the present invention. In FIG. 8, portions corresponding to those shown in FIG. 2A are denoted by the same reference numerals. Other constructions of the multilayer LC composite component according to the fifth preferred embodiment are preferably the same as those of the multilayer LC composite component according to the first preferred embodiment.

In the fifth preferred embodiment, as shown in FIG. 8, each of the ground-side capacitor electrodes 15 has a cross-shaped pattern including an electrode-free area 24 at the approximate central region thereof and a cross-shaped cut portion (electrode-free area) 41. The vertical portion of the cross-shaped pattern includes two slit-shaped cut portions (electrode-free areas) 25a and 25b which extend approximately vertically, and the horizontal portion of the cross-shaped pattern includes two slit-shaped cut portions (electrode-free areas) 26a and 26b which extend approximately horizontally. Accordingly, the cross-shaped cut portion (electrode-free area) 41 is defined by the substantially circular electrode-free area 24 and the slit-shaped cut portions 25a, 25b, 26a, and 26b.

More specifically, the cross-shaped ground-side capacitor electrode 15 is divided into four sections by the slit-shaped cut portions 25a, 25b, 26a, and 26b, and predetermined portions of the ground-side capacitor electrode 15 extend to each of the four sides 21a, 21b, 22a, and 22b of the dielectric layer 16 having an approximately square shape.

Also when each of the ground-side capacitor electrodes 15 is constructed as in the fifth preferred embodiment, the bonding strength between the layers can be increased and a highly reliable multilayer LC composite component can be obtained.

Although not shown in the figure, also in the fifth preferred embodiment, each of the signal-side capacitor electrodes 13 may have the electrode-free areas as shown in FIGS. 5B, 6B, or 7B. Alternatively, the electrode-free area may also be omitted as shown in FIG. 2B.

In the multilayer LC composite components according to the above-described first to fifth preferred embodiments, dielectric members (dielectric ceramic green sheets) are used in both the coil unit and the capacitor unit. However, the construction may also be such that magnetic members (magnetic ceramic green sheets) are used in the coil unit and dielectric members (dielectric ceramic green sheets) are used in the capacitor unit.

In addition, although two signal-side capacitor electrodes and two ground-side capacitor electrodes are provided in the above-described preferred embodiments, the number of the signal-side capacitor electrodes and that of the ground-side capacitor electrodes are not limited. For example, the number of the signal-side capacitor electrodes and that of the ground-side capacitor electrodes may both be one, three, or more. In addition, the pattern of the internal electrodes included in the coil unit is not limited, and arbitrary patterns may be used. Furthermore, the number of windings of the coil unit and the number of layers of the coil pattern are also not limited.

In addition, although the electrode-free area formed in the ground-side capacitor electrodes at the periphery of the penetrating electrode (via-hole electrode) preferably has a substantially circular shape in the above-described preferred embodiments, the shape of this electrode-free area is not limited to being substantially circular, and it may also be substantially elliptical, substantially rectangular, or other suitable shape.

In addition, in the multilayer LC composite components of the above-described preferred embodiments, the coil units have a so-called horizontal-winding construction in which the coil axis is substantially parallel to the mounting surface. However, the present invention may also be applied to multilayer LC composite components including coil units having a so-called vertical-winding construction in which the coil axis is substantially perpendicular to the mounting surface.

In addition, the equivalent circuit of the multilayer LC composite components of the above-described preferred embodiments is a T-type (L-C-L) circuit shown in FIG. 4. However, the present invention may also be applied to multilayer LC composite components whose equivalent circuit is a π-type (C-L-C) circuit or an L-type (C-L or L-C) circuit.

Furthermore, the present invention is also not limited to the above-described preferred embodiments with respect to other points, and various modifications are possible within the scope of the present invention with respect to, for example, the shapes of the ground-side capacitor electrodes and the signal-side capacitor electrodes, the shapes of the electrode-free areas formed in the ground-side capacitor electrodes and the signal-side capacitor electrodes, the shape and configuration of the coil pattern, the position of the penetrating electrodes, etc.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A multilayer LC composite component comprising:
   a coil unit including a stack of coil conductors, two adjacent coil conductors being separated by an insulating layer and being electrically connected to each other; and
   a capacitor unit including a ground-side capacitor electrode and a signal-side capacitor electrode which oppose each other with an insulating layer therebetween, the ground-side capacitor electrode having an electrode-free area at an approximately central region thereof and the signal-side capacitor electrode being electrically connected to the coil unit via the electrode-free area;
   wherein the ground-side capacitor electrode extends to at least two opposing sides of the insulating layer and has a cut portion which extends continuously from the electrode-free area.

2. A multilayer LC composite component according to claim 1, wherein the ground-side capacitor electrode has line symmetry with respect to a direction that is substantially parallel to the two opposing sides of the insulating layer.

3. A multilayer LC composite component according to claim 1, wherein the ground-side capacitor electrode is divided by the cut portion.

4. A multilayer LC composite component according to claim 1, wherein the ground-side capacitor electrode is divided into four sections by the cut portion, and two of the four sections extend to one of the two opposing sides of the insulating layer and the other two of the four sections extend to the other one of the two opposing sides.

5. A multilayer LC composite component according to claim 1, wherein the multilayer LC composite component is a T-type LC noise filter.

6. A multilayer LC composite component according to claim 1, wherein the cut portion is cross-shaped.

7. A multilayer LC composite component according to claim 6, wherein the cross-shaped cut portion includes a first pair of slit-shaped cut portions defining electrode-free areas which extend approximately vertically, and a second pair of slit-shaped cut portions defining electrode-free areas which extend approximately horizontally.

8. A multilayer LC composite component according to claim 7, wherein the ground-side capacitor electrode is divided into four sections by the slit-shaped cut portions.

9. A multilayer LC composite component according to claim 1, wherein the electrode-free area has an approximately circular shape.

10. A multilayer LC composite component according to claim 1, wherein the signal-side capacitor electrode has a substantially square pattern.

11. A multilayer LC composite component according to claim 1, wherein the signal-side capacitor electrode has a substantially X-shaped pattern.

12. A multilayer LC composite component according to claim 1, wherein the signal-side capacitor electrode has a substantially H-shaped pattern.

13. A multilayer LC composite component according to claim 1, wherein the ground-side capacitor electrode has a substantially ring-shaped configuration.

14. A multilayer LC composite component according to claim 1, wherein the signal-side capacitor electrode has a substantially bracket-shaped pattern.

15. A multilayer LC composite component according to claim 14, wherein the ground-side capacitor electrode has a substantially ring-shaped configuration.

16. A multilayer LC composite component according to claim 1, wherein the ground-side capacitor electrode has a substantially cross-shaped configuration.

17. A multilayer LC composite component according to claim 1, wherein an equivalent circuit of the multilayer LC composite component is one of a T-type circuit, a $\pi$-type circuit and an L-type circuit.

* * * * *